(12) United States Patent
Suesada et al.

(10) Patent No.: US 7,615,874 B2
(45) Date of Patent: Nov. 10, 2009

(54) ELECTRONIC COMPONENT MODULE

(75) Inventors: Tsuyoshi Suesada, Moriyama (JP); Kazuaki Higashibata, Hook (JP); Toshihiro Hosokawa, Yasu (JP); Masaki Kawata, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/743,216

(22) Filed: May 2, 2007

(65) Prior Publication Data

US 2007/0200221 A1    Aug. 30, 2007

Related U.S. Application Data

(63) Continuation of application No. PCT/JP2006/306437, filed on Mar. 29, 2006.

(30) Foreign Application Priority Data

Apr. 18, 2005    (JP)    ............... 2005-120144

(51) Int. Cl.
  H01L 23/48    (2006.01)
  H01L 23/52    (2006.01)
  H01L 29/40    (2006.01)
(52) U.S. Cl. .................. 257/786; 257/737; 257/784
(58) Field of Classification Search .......... 257/737–738, 257/777–794, E23.009, E23.02, E23.021
See application file for complete search history.

(56) References Cited

U.S. PATENT DOCUMENTS 6,743,979 B1 *   6/2004   Berman et al. .............. 257/787
6,903,458 B1 *   6/2005   Nathan ....................... 257/737
2002/0109226 A1 *   8/2002   Khan et al. ................. 257/737
2004/0046262 A1 *   3/2004   Watanabe et al. ........... 257/777

FOREIGN PATENT DOCUMENTS

JP    62-123744 A    6/1987

(Continued)

OTHER PUBLICATIONS

Official Communication for PCT Application No. PCT/JP2006/306437; mailed Jun. 27, 2006.

(Continued)

*Primary Examiner*—Cuong Q Nguyen
(74) *Attorney, Agent, or Firm*—Keating & Bennett, LLP (57) ABSTRACT

An electronic component module is provided with a ceramic substrate and a plurality of bonding material applying lands. The ceramic substrate has a rear surface that is substantially rectangular. The plurality of bonding material applying lands are arranged on the rear surface. The plurality of bonding material applying lands includes outer peripheral land rows, each of which is arranged in a line along each side of the rear surface with the exception of corner portions of the rear surface. The plurality of bonding material applying lands includes corner portion inner lands, each of which is arranged on the rear surface at a location that is shifted inwardly in a substantially diagonal direction from the corner portion and is adjacent to the bonding material applying lands closest to the corner portion at ends of the outer peripheral land rows that are arranged in lines along two sides that are connected by the corner portion.

7 Claims, 7 Drawing Sheets

FOREIGN PATENT DOCUMENTS

| | | |
|---|---|---|
| JP | 09-148475 A | 6/1997 |
| JP | 10-079405 A | 3/1998 |
| JP | 10-098073 A | 4/1998 |
| JP | 2002-100703 A | 4/2002 |
| JP | 2003-179175 A | 6/2003 |
| JP | 2003-218489 A | 7/2003 |
| JP | 2003-338585 A | 11/2003 |

OTHER PUBLICATIONS

Official communication issued in counterpart Korean Application No. 10-2007-7009850, mailed on Feb. 28, 2008.

* cited by examiner

ELECTRONIC COMPONENT MODULE

BACKGROUND OF THE INVENTION

1. Field of the Invention

The present invention relates to an electronic component module, and more specifically, to an electronic component module that is provided with a ceramic substrate. In particular, the present invention relates to a high-frequency module that includes a number of terminal electrodes arranged on the rear surface.

2. Description of the Related Art

Figure 12:
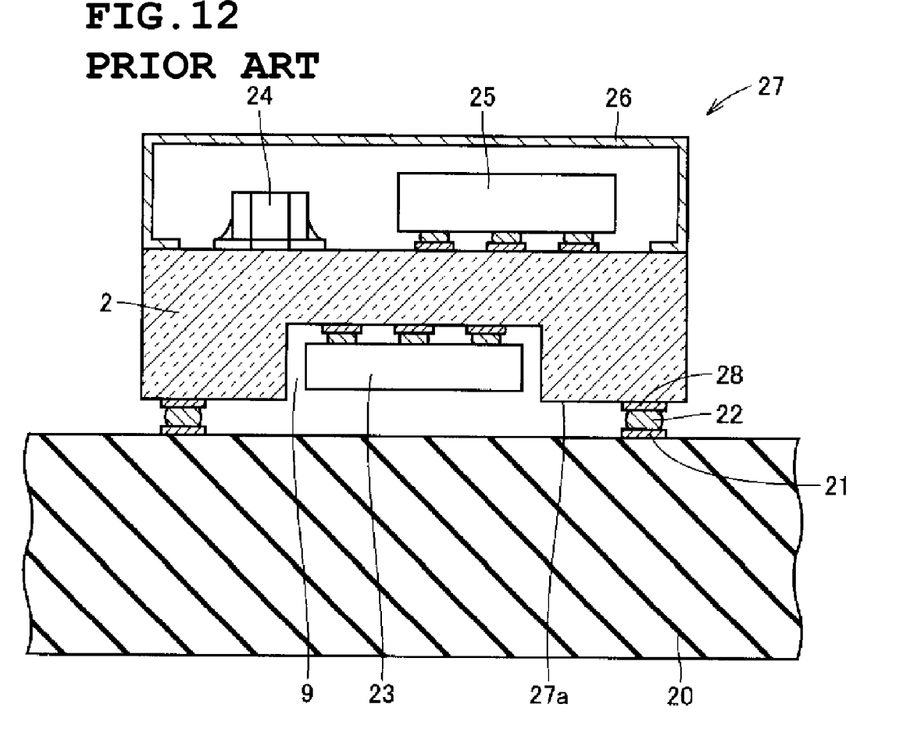
FIG. 12 is a cross-sectional view that shows a state where a high-frequency module is used according to the known art.

A high-frequency module is an example of an electronic component module that is provided with a ceramic substrate. A high-frequency module that integrates devices having various functions, such as switches, filters, couplers, baluns and amplifiers, is used for wireless devices, such as mobile communication devices and wireless LANs. The high-frequency module is configured so that surface mounting components, such as semiconductor devices and ceramic capacitors, which define functional devices, are mounted on the front surface of a ceramic multilayer substrate, wherein wiring that electrically interconnects surface mounting components and functional devices, such as capacitors and inductors, are embedded in the ceramic multilayer substrate. An example of such a high-frequency module is shown in FIG. 12. The high-frequency module 27 is mounted on a printed wiring board 20 as a motherboard in a wireless device. A number of terminal electrodes 28 are provided on the rear surface 27a of the high-frequency module 27. The high-frequency module 27 is mounted on the printed wiring board 20, and the terminal electrodes 28 on the side of the high-frequency module 27 and the surface electrodes 20 on the side of the printed wiring board 20 are welded together using solder 22. The terminal electrodes 28, which are also called "lands", have been arranged to completely surround the rear surface 27a of the high-frequency module 27 along the outer periphery, including the corner portions. This arrangement is not only applied to high-frequency modules but also to other electronic components that are provided with ceramic substrates.

Figure 13:
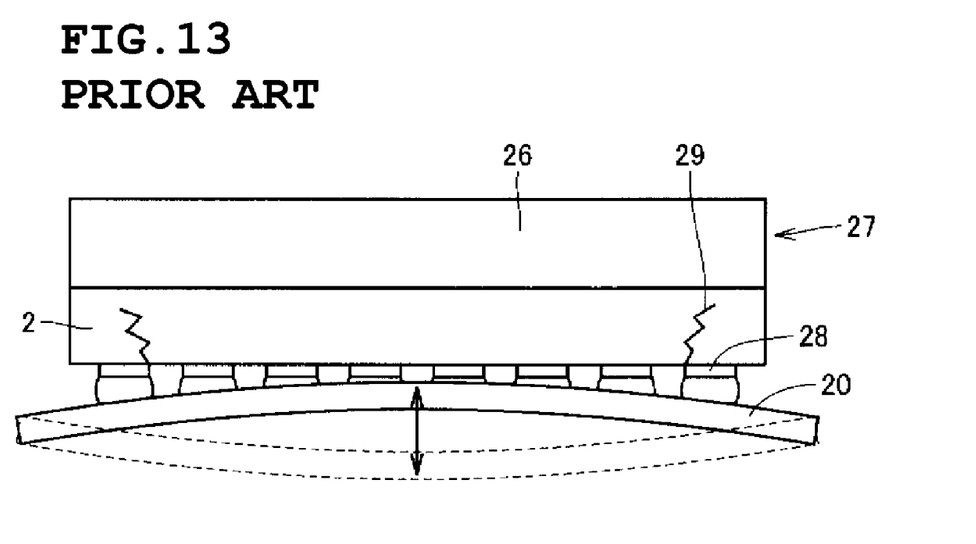
FIG. 13 is a view that illustrates a state where a motherboard mounted with a high-frequency module is bending according to the known art.

FIG. 13 shows, in the case of the high-frequency module 27, a state in which a motherboard on which the electronic component module is mounted is subjected to a shock due to a drop, or other external force. When bending or deformation is developed in the printed wiring board 20 as a motherboard, stress concentration occurs at soldered portions between the terminal electrodes 28 on the side of the high-frequency module 27 as an electronic component module and the electrodes on the motherboard side. As a result, the ceramic substrate 2 included in the electronic component module can easily develop a crack 29 or peeling of the terminal electrodes 28 may occur. However, in recent years there has been a need for wireless devices, such as mobile communication devices, that have high durability and reliability against a shock such as that due to a drop. For this reason, electronic component modules must to have enhanced resistance against a shock such as that due to a drop (hereinafter, called "shock resistance").

In order to improve shock resistance, Japanese Unexamined Patent Application Publication No. 2003-218489 (Patent Document 1) discloses a structure in which recesses or openings are provided in terminal electrodes that are arranged at the four corners of a rear surface. Japanese Unexamined Patent Application Publication No. 2003-179175 (Patent Document 2) discloses a structure in which circular arc-shaped cutouts are provided in terminal electrodes that are arranged at the four corners. Japanese Unexamined Patent Application Publication No. 2003-338585 (Patent Document 3) discloses a structure in which the outer shapes of terminal electrodes that are arranged at the four corners are wave-shaped. These inventions consider that, when the wireless device is subjected to an impact, terminal electrodes that are arranged at the four corners are subjected to a large impact force. Thus, the inventions are intended to enhance the bonding strength between the terminal electrodes at the four corners and at solder portions.

However, there is a definite limit to how much the bonding strength can be improved only by changing the shapes of terminal electrodes as disclosed in the Patent Documents 1 to 3. In other words, there has been a definite limit to how much the shock resistance can be improved using techniques in the known art that are directed to enhancing the bonding strength of the terminal electrodes at the four corners where stress tends to be concentrated.

SUMMARY OF THE INVENTION

To overcome the problems described above, preferred embodiments of the present invention provide an electronic component module that has further enhanced shock resistance and that is less likely to be damaged if bending or deformation is developed in the motherboard due to a shock, such as a drop.

An electronic component module according to a preferred embodiment of the present invention includes a ceramic substrate and a plurality of bonding material applying lands. The ceramic substrate has a rear surface whose outer shape is preferably substantially rectangular. The plurality of bonding material applying lands are arranged on the rear surface. The plurality of bonding material applying lands include outer peripheral land rows. Each of the outer peripheral land rows is arranged in a line along each side of the rear surface with the exception of corner portions of the rear surface. The plurality of bonding material applying lands include corner portion inner lands. Each of the corner portion inner lands is arranged on the rear surface at a location that is shifted inwardly in a substantially diagonal direction from the corner portion and is adjacent to the bonding material applying lands closest to the corner portion at one of the ends of the outer peripheral land rows that are arranged in lines along two sides that are connected by the corner portion.

In accordance with preferred embodiments of the present invention, no bonding material applying lands are present at the corner portions and the corner portion inner lands are provided. Thus, when mounted on a motherboard, no portions to which bonding material is applied are present at the corner portions. This removes stress concentration at the corner portions and prevents cracks or peeling from occurring. Thus, shock resistance is enhanced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1:
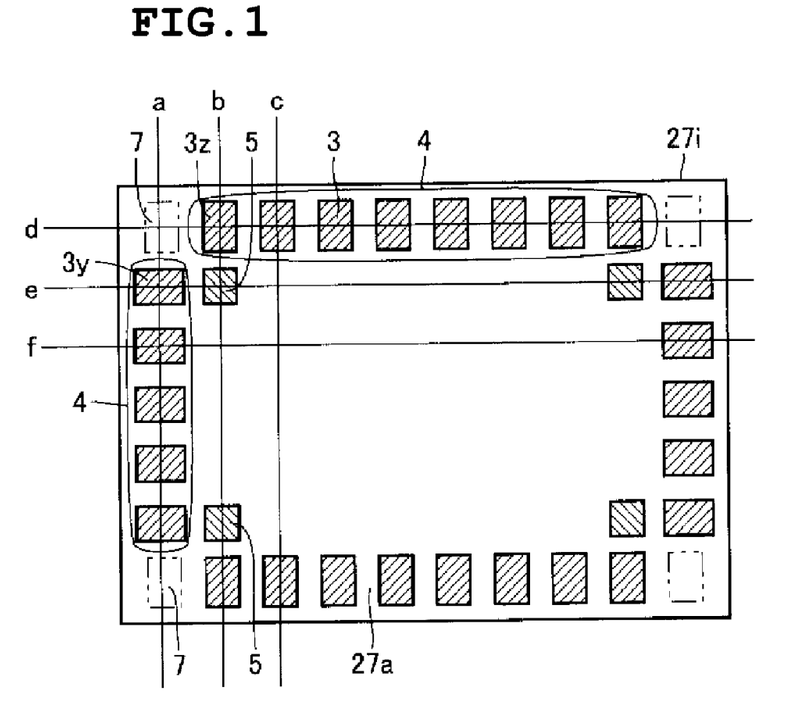
FIG. 1 is a rear surface view of an electronic component module in a first preferred embodiment according to the present invention.

An electronic component module in a first preferred embodiment according to the present invention will be described with reference to FIG. 1. FIG. 1 shows the rear surface 27a of the electronic component module 27i, that is, the surface on which soldering lands are arranged. The electronic component module 27i is an electronic component module that is provided with a ceramic substrate and a plurality of soldering lands 3. The ceramic substrate has the rear surface 27a preferably having a substantially rectangular shape. The plurality of soldering lands 3 are arranged on the rear surface 27a. The plurality of soldering lands 3 include outer peripheral land rows 4. Each of the outer peripheral land rows 4 is arranged in a line along each side of the rear surface 27a with the exception of corner portions 7 of the rear surface 27a. The corner portions 7 are areas in which no lands are present. However, lands are arranged in the areas of the corner portions 7 according to the known art. Therefore, for the purpose of clear differentiation, FIG. 1 shows the outlines of imaginary lands by a two-dotted line. The plurality of soldering lands 3 include corner portion inner lands 5. Each of the corner portion inner lands 5 is arranged on the rear surface 27a at a location that is shifted inwardly in a substantially diagonal direction from the corner portion 7 and is adjacent to the soldering lands 3 closest to the corner portion 7 at ends of the outer peripheral land rows 4 that are arranged in lines respectively along two sides sandwich the corner portion 7. The corner portion inner lands 5 may be similar to the soldering lands 3.

No lands are present at locations that are adjacent to the corner portion inner lands 5 in a substantially diagonal direction of the rear surface 27a. Thus, the locations are free areas. In other words, in the electronic component module 27i according to the present preferred embodiment, no soldering land is present at the point at which the hypothetical line a and the hypothetical line d intersect shown in FIG. 1, that is, no soldering land is present at the corner portion 7, while a soldering land, that is, the corner portion inner land 5, is present at the point at which the hypothetical line b and the hypothetical line e intersect. In addition, no soldering land is present in the area inside the point at which the hypothetical line c and the hypothetical line f intersect.

Note that the hypothetical line a is a hypothetical straight line that extends substantially through the centers of the soldering lands of the outer peripheral land row 4 that is arranged along one short side of the substantially rectangular rear surface 27a. The hypothetical line d is a hypothetical straight line that extends substantially through the centers of the soldering lands of the outer peripheral land row 4 that is arranged along one long side. The hypothetical line b is a straight line that is substantially parallel with the hypothetical line a. The hypothetical line b extends through the center of the land closest to the corner portion 7 in the outer peripheral land row 4 that is arranged along the one long side. The hypothetical line e is a straight line that is substantially parallel with the hypothetical line d. The hypothetical line e extends through the center of the land closest to the corner portion 7 in the outer peripheral land row 4 that is arranged along the one short side. The hypothetical line c is a straight line that is substantially parallel with the hypothetical lines a and b. The hypothetical line c extends through the center of the land next to the land closest to the corner portion 7 in the outer peripheral land row 4 that is arranged along the one long side. The hypothetical line f is a straight line that is parallel with the hypothetical lines d and e. The hypothetical line f extends through the center of the land next to the land closest to the corner portion 7 in the outer peripheral land row 4 that is arranged along the one short side.

Note that the shape of the lands that define the outer peripheral land rows may preferably be substantially rectangular. However, the shape of the corner portion inner lands is preferably substantially square. In particular, the short sides of the lands that define the outer peripheral land rows preferably have the same width as the sides of the corner portion inner lands. This is because stress that is concentrated at the corner portion inner lands tends to be dispersed.

In an electronic component module in which soldered lands are arranged at the corner portions, when the device is subjected to a shock, stress concentration occurs at the lands that are soldered at the corner portions, which results in cracking or peeling. However, in the present preferred embodiment, because no soldering lands 3 are present at the corner portions 7 of the electronic component module mounted on the motherboard, no soldered portions are present at the corner portions. This removes stress concentration at the corner portions, and thus, prevents the development of cracks or peeling. According to the present preferred embodiment, shock resistance is thus enhanced.

If soldering lands are simply omitted from the corner portions 7, the number of lands to be arranged is reduced, so that the presence of a desired number of lands may not be ensured. However, in the present preferred embodiment, the same number of the corner portion inner lands 5 as soldering lands omitted from the corner portions 7 is provided. This enables the number of lands that are arrangeable on the rear surface 27a to be maintained. In addition, the bonding strength between an electronic component module and a motherboard is enhanced. Thus, shock resistance is further improved.

Here, "solder" is preferably used as a bonding material. However, the bonding material is not limited to solder, and may be another type of bonding material. For example, the bonding material may be an electrically conductive adhesive. The electrically conductive adhesive may be a mixture of adhesive resin with conductive particles, for example. The soldering land is a type of bonding material applying land. This also applies to the following preferred embodiments.

The rear surface 27a preferably has a substantially rectangular shape. However, "substantially rectangular shape" according to the present invention not only includes rectangles other than squares, but also includes squares.

In addition, the ceramic substrate may be a ceramic multilayer substrate that is formed by laminating a plurality of ceramic layers. In this case, the material for forming the ceramic layers may preferably be a low-temperature co-fired ceramic ("LTCC") material. The low-temperature co-fired ceramic material is sinterable at a firing temperature equal to or less than about 1050 degrees Celsius. The low-temperature co-fired ceramic material may be sintered at the same time with a low-melting-point metal having a small specific resistance, such as silver and copper. Thus, the low-temperature co-fired ceramic is suitable for a ceramic multilayer substrate used for a high-frequency module. The low-temperature co-fired ceramic material specifically includes a glass composite LTCC material made of a mixture of ceramic particles, such as alumina and forsterite, with borosilicic acid glass, a crystallized glass-based LTCC material that uses $ZnO$—$MgO$—$Al_2O_3$—$SiO_2$-based crystallized glass, and a non-glass-based LTCC material that uses $BaO$—$Al_2O_3$—$SiO_2$-based ceramic particles, $Al_2O_3$—$CaO$—$SiO_2$—$MgO$—$B_2O_3$-based ceramic particles, or other suitable material.

In the case of a ceramic multilayer substrate, the ceramic multilayer substrate may internally include conductor patterns, such as plane conductor patterns and interfacial connection conductor patterns. These conductor patterns may be used as functional device patterns, such as capacitor patterns and inductor patterns, in addition to wiring patterns. The lands provided on the rear surface are preferably electrode patterns that are obtained by firing at the same time with a low-temperature co-fired ceramic material because adhesion to the ceramic multilayer substrate is improved.

Second Preferred Embodiment

Figure 2:
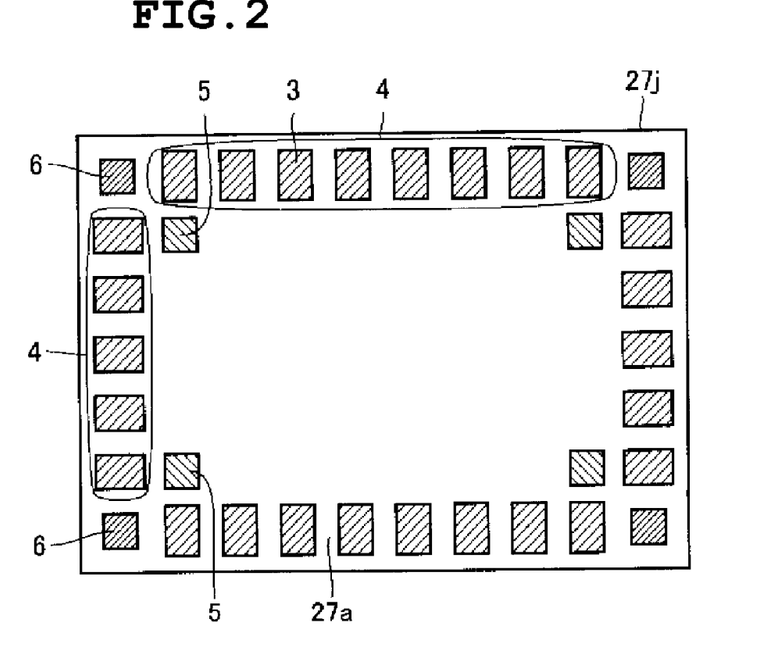
FIG. 2 is a rear surface view of an electronic component module in a second preferred embodiment according to the present invention.

An electronic component module in a second preferred embodiment according to the present invention will be described with reference to FIG. 2. FIG. 2 shows the rear surface 27a of the electronic component module 27j. The electronic component module 27j is provided with the following structure in addition to the structure described in the first preferred embodiment. That is, non-soldering lands 6 are arranged at the corner portions of the rear surface 27a. The non-soldering lands 6 are lands that need not be soldered when the electronic component module 27j is mounted on the motherboard. For example, testing lands correspond to the non-soldering lands 6. The term "testing land" is a land that is electrically connected to a wiring pattern provided on the front surface or inside of the ceramic substrate for testing its electrical characteristics.

In this preferred embodiment, lands are arranged at the corner portions 7. However, the lands are not the soldering lands 3, and instead, are the non-soldering lands 6. Thus, the corner portions remain unsoldered when the electronic component module 27j is mounted on the motherboard. Even if the motherboard on which the electronic component module 27j is mounted is subjected to a shock, because the non-soldering lands 6 are not soldered, no stress concentration occurs at the corner portions. Thus, the same advantages as described with respect to the first preferred embodiment are obtained.

When lands such as testing lands that are not soldered are included in a plurality of lands of an electronic component module, such lands are preferably arranged at the corner portions and soldering is not performed for the lands at the corner portions. With this arrangement, in comparison to the known art, stress concentration at the corner portions is avoided, while maintaining the total number of lands that are arranged on the rear surface 27a. This prevents the development of cracks or peeling. Thus, shock resistance is enhanced.

Figure 3:
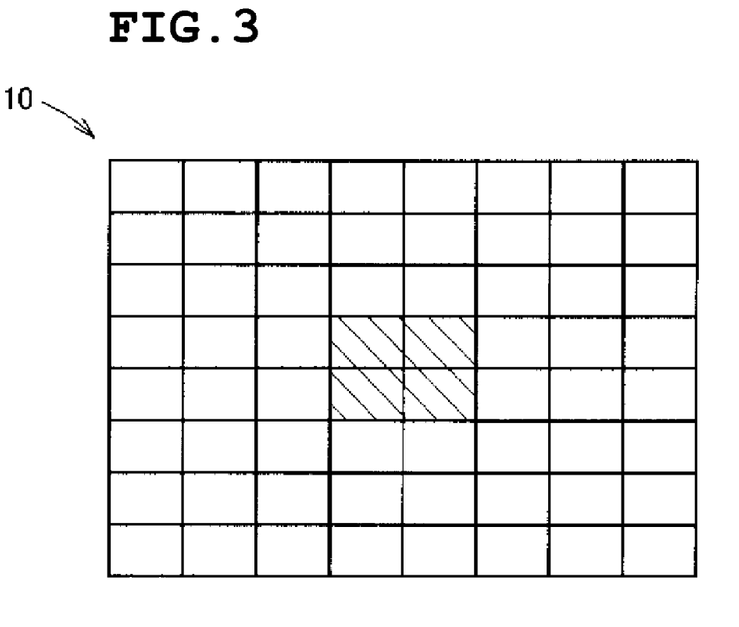
FIG. 3 is a plan view of an integrated substrate that is used for description of the second preferred embodiment according to the present invention.
Figure 4:
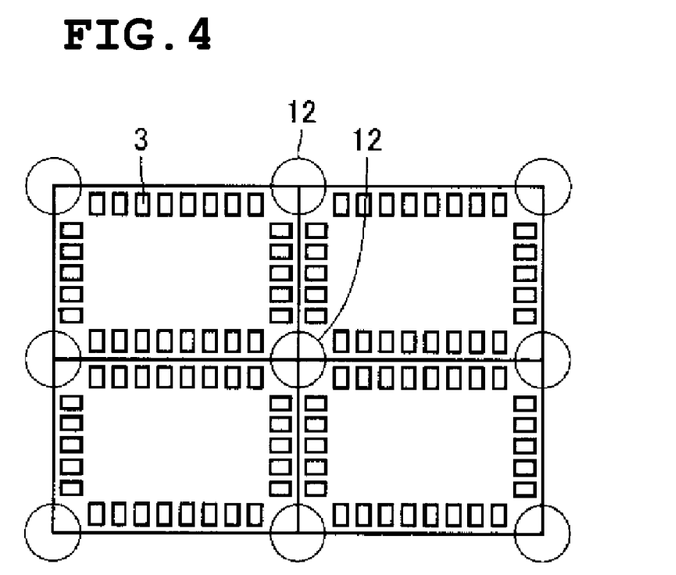
FIG. 4 is a partially enlarged plan view of the integrated substrate that is used for description of the second preferred embodiment according to the present invention.
Figure 5:
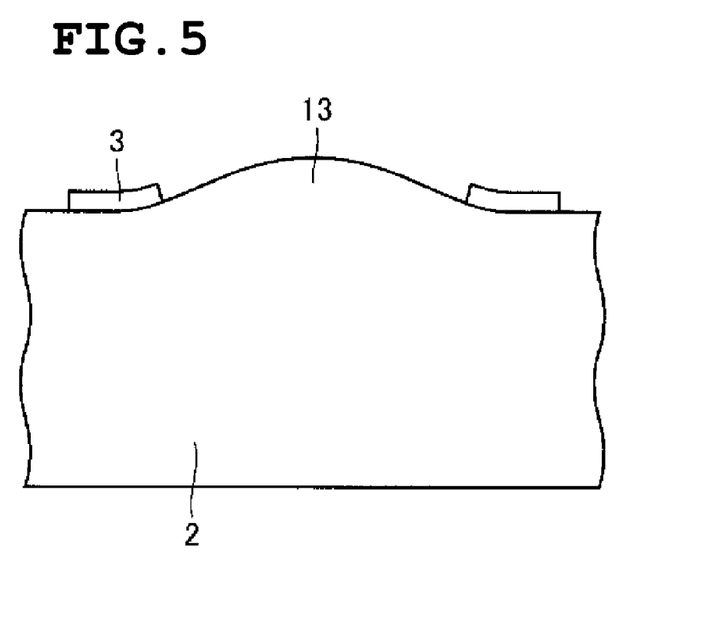
FIG. 5 is a view that illustrates a strain developed in a ceramic substrate that is used for description of the second preferred embodiment according to the present invention.
Figure 6:
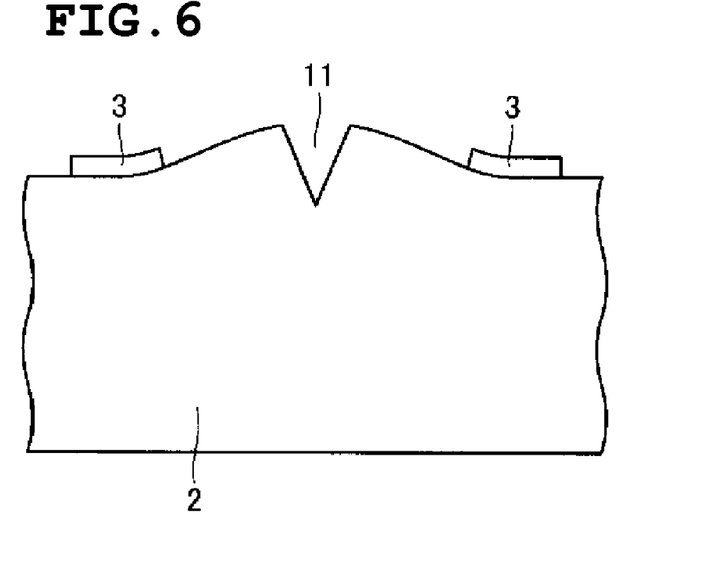
FIG. 6 is a view that illustrates a breaking groove provided in the ceramic substrate that is used for description of the second preferred embodiment according to the present invention.

The manufacture of an electronic component module that includes a ceramic multilayer substrate may be performed as follows: firing a ceramic substrate in a state in which a large number of child substrates that are to be separate products are connected lengthwise and breadthwise, so-called, in a state of an integrated substrate; after that, forming breaking grooves; and then dividing the ceramic substrate into the child substrates along the breaking grooves. At this time, when no lands are present at the corner portions of the child substrates as shown in FIG. 1, because the metal material of lands has a coefficient of contraction that is different from that of the ceramic material of the child substrates, when fired in a state of an integrated substrate, the substrate is likely to have a large strain. FIG. 3 shows an integrated substrate 10, which is an example of an integrated substrate when manufacturing child substrates having no lands at the corner portions. In FIG. 3, each grid corresponds to a child substrate. FIG. 4 shows an enlarged view of four child substrates (portions with hatching) that are arranged 2×2 at the center of the integrated substrate 10. Because there are no lands at the intersection portions 12 of the boundaries between the child substrates, a strain 13 will be developed on the front surface of the ceramic substrate 2 as shown in FIG. 5 during firing due to differences in coefficients of contraction. When the breaking groove 11 as shown in FIG. 6 is formed in this state, the ceramic substrate 2 will break immediately from the breaking groove 11. This phenomenon is a so-called "substrate fracture".

According to the electronic component module 27j of the present preferred embodiment as shown in FIG. 2, the non-soldering lands 6 are arranged at the corner portions. In the present preferred embodiment, lands may be arranged without any vacant zones at the intersection portions 12 as shown in FIG. 4. In addition, the non-soldering lands 6 may be made of metal as in the case of the soldering lands 3. This enables conditions with respect to the coefficient of contraction to be substantially the same as those of other portions. Thus, strain and substrate fracture are prevented.

Figure 7:
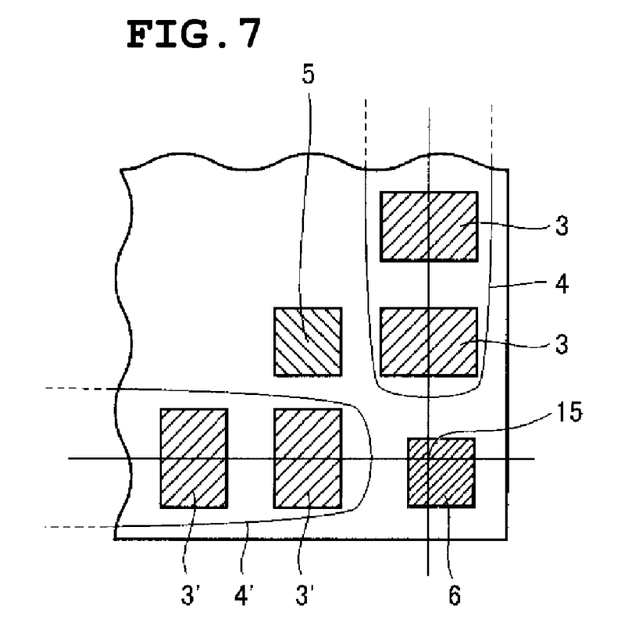
FIG. 7 is a partially enlarged rear surface view of a preferred alternative embodiment of the electronic component module in the second preferred embodiment according to the present invention.

Furthermore, the non-soldering land has a smaller area than the soldering land. As shown in FIG. 7, the non-soldering land 6 is preferably arranged so that the center of the non-soldering land 6 is located outside the intersection point 15 between the line that extends through the centers of the soldering lands 3 of the outer peripheral land row 4 on one side of the rear surface 27a and the line that extends through the centers of the soldering lands 3' of the outer peripheral land row 4' on the adjacent side. When the areas of the non-soldering lands are less than the areas of the soldering lands, this arrangement effectively prevents strain and peeling. Furthermore, this arrangement reduces the likelihood of misidentification between non-soldering lands and soldering lands.

Third Preferred Embodiment

Figure 8:
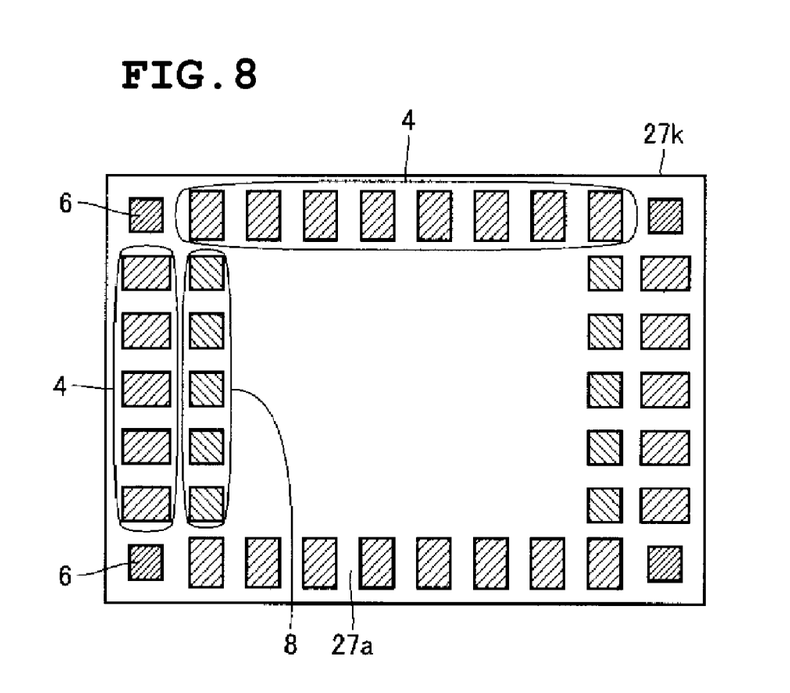
FIG. 8 is a rear surface view of an electronic component module in a third preferred embodiment according to the present invention.

An electronic component module of a third preferred embodiment according to the present invention will be described with reference to FIG. 8. FIG. 8 shows the rear surface 27*a* of the electronic component module 27*k*. The electronic component module 27*k* is provided with the following structure in addition to the structure described in the first and second preferred embodiments. That is, the electronic component module 27*k* includes one or more short side inner land rows 8 that are arranged in lines along each short side of the substantially rectangular rear surface 27*a* and adjacent to the inner side of the outer peripheral land row 4.

In this preferred embodiment, because the bonding area may be increased between the electronic component module 27*k* and the motherboard, while avoiding stress concentration at the corner portions, shock resistance is enhanced.

The short side inner land row 8 may be arranged on only one of the short sides. However, it is preferable that the short side inner land row 8 is arranged on each of two mutually opposite short sides.

In addition, as shown in FIG. 8, it is preferable that one land row is arranged on the long side and two land rows are arranged on the short side. When the number of rows is increased to a value larger than these, shock resistance may be adversely effected.

Figure 9:
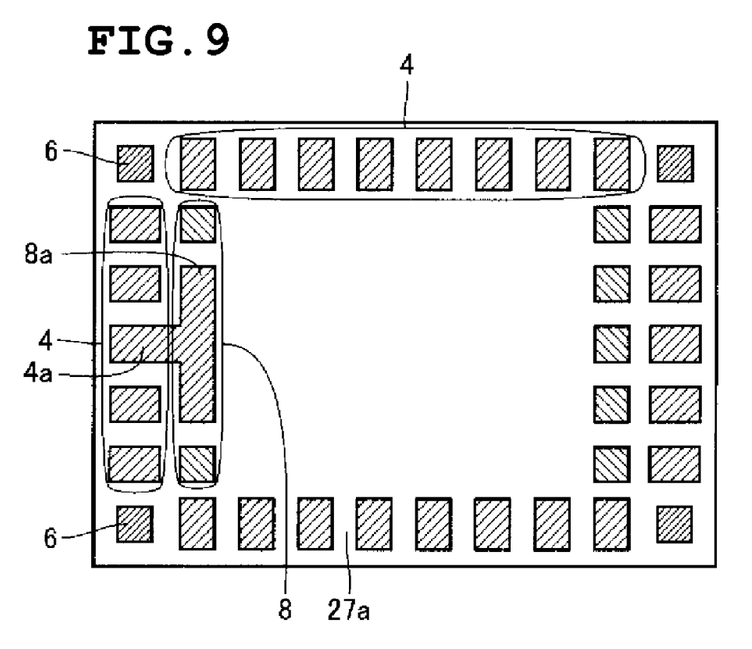
FIG. 9 is a rear surface view of a first alternative embodiment of the electronic component module in the third preferred embodiment according to the present invention.
Figure 10:
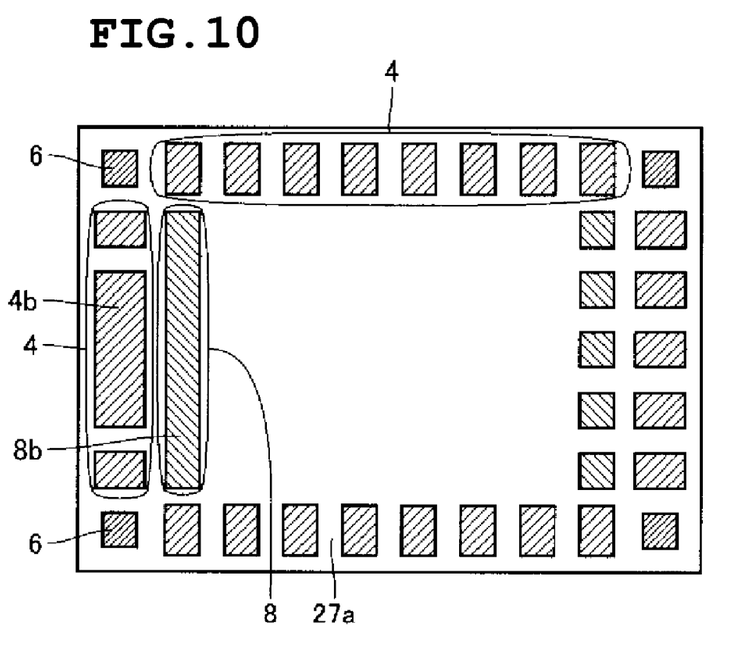
FIG. 10 is a rear surface view of a second alternative embodiment of the electronic component module in the third preferred embodiment according to the present invention.

In addition, as shown in FIG. 9, a land 4*a* of the outer peripheral land row 4 and a land 8*a* of the short side inner land row 8 may be connected on the rear surface 27*a*. As shown in FIG. 10, the outer peripheral land row 4 and the short side inner land row 8 may include a land having a different area from the other lands in the same group of lands. In the example shown in FIG. 10, the outer peripheral land row 4 includes a land 4*b*, and the short side inner land row 8 includes a land 8*b*. The lands 4*b*, 8*b* each have a greater area than the other lands. In this example, the lands 4*b*, 8*b* have shapes such that a plurality of lands are connected while maintaining their original locations. When there are a plurality of lands having the same function, these plurality of lands may be integrated as one large land. Thus, shock resistance is improved.

Fourth Preferred Embodiment

Figure 11:
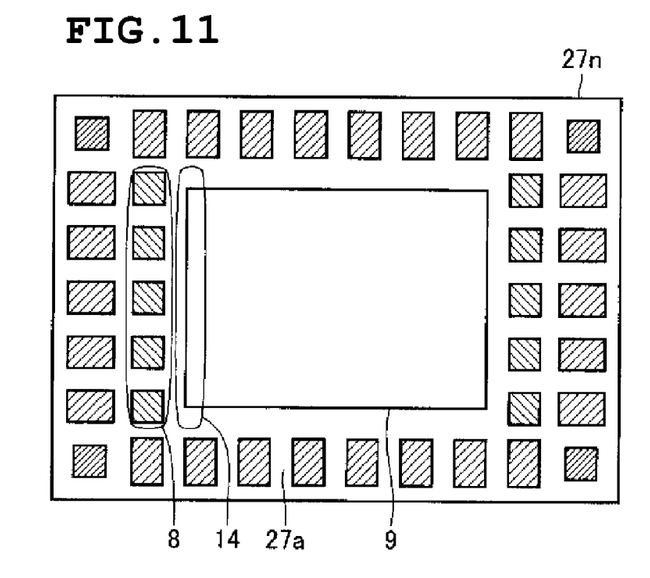
FIG. 11 is a rear surface view of an electronic component module in a fourth preferred embodiment according to the present invention.

An electronic component module according to a fourth preferred embodiment according to the present invention will be described with reference to FIG. 11. FIG. 11 shows the rear surface 27*a* of the electronic component module 27*n*. The electronic component module 27*n* is provided with the following structure in addition to the structure described in the first through third preferred embodiments. That is, a recess (cavity) 9 is arranged on the rear surface 27*a* so as to include an adjacent portion 14 that is located adjacent to the inner side of the short side inner land row 8. The recess 9 is preferably provided at the center of the rear surface 27*a*.

In this preferred embodiment, because the recess 9 is provided at the location that is adjacent to the inner side of the short side inner land row 8 on the rear surface 27*a*, the degree of contact between the rear surface 27*a* and the motherboard is reduced when the motherboard is bent as shown in FIG. 13. Thus, shock resistance is enhanced. In particular, it is preferable that the recess 9 is provided at the center of the rear surface 27*a* because the degree of contact between the center portion of the rear surface 27*a* and the motherboard is reduced when the motherboard is bent. The structure in which the recess 9 is provided is not only applied to the third preferred embodiment as shown in FIG. 11, but it may be applied to the first and second preferred embodiments.

As described in the present preferred embodiment, it is preferable that the recess 9 is arranged so as to include the adjacent portion 14 that is located adjacent to the inner side of the short side inner land row 8. This ensures the largest possible area for the recess 9. Thus, contact with the motherboard is reliably avoided. However, the recess that is arranged at the center of the rear surface without including the adjacent portion 14 also has an advantageous effect. This is because, when the motherboard is bent into a convex shape, the portion that is most likely to contact the motherboard is the center.

The electronic component modules as described in the above preferred embodiments preferably include surface mounting components that are mounted on the front surface, and thus, a high-performance electronic component module is provided. The surface mounting components that are mounted on the front surface may be, for example, the surface mounting components 24, 25 that are shown in FIG. 12. At the same time, the surface mounting component 23 may be mounted in the recess 9.

Experimental Example

An experiment for comparing shock resistance was conducted using the electronic component modules as described in the above preferred embodiments and the electronic component modules according to the known art. The experiment was conducted so that a drop cycle was repeated using the electronic component modules of the respective structure, and the number of drop cycles that the electronic component modules were able to withstand was examined. The results are shown in Table 1.

TABLE 1

| TYPE OF SAMPLE | NUMBER OF WITHSTOOD DROP CYCLES | DESCRIPTION |
| --- | --- | --- |
| STRUCTURE 1 OF KNOWN ART | 3 | WITH SOLDERING LANDS AT CORNER PORTIONS 7 NO CORNER PORTION INNER LANDS 5 |
| STRUCTURE 2 OF KNOWN ART | 5 | NO SOLDERING LANDS AT CORNER PORTIONS 7 NO CORNER PORTION INNER LANDS 5 |
| STRUCTURE OF FIG. 1 | 8 | NO SOLDERING LANDS AT CORNER PORTIONS 7 WITH CORNER PORTION INNER LANDS 5 |
| STRUCTURE OF FIG. 2 | 8 | WITH NON-SOLDERING LANDS 6 AT CORNER PORTIONS WITH CORNER PORTION INNER LANDS 5 |
| STRUCTURE OF FIG. 11 | 15 | WITH NON-SOLDERING LANDS 6 AT CORNER PORTIONS WITH SHORT SIDE INNER LAND LOWS 8 WITH CAVITY |

"STRUCTURE 1 OF KNOWN ART" in Table 1 refers to the structure shown in FIG. 1 in which the corner portion inner lands 5 are omitted and the soldering lands 3 are arranged at the corner portions 7. "STRUCTURE 2 OF KNOWN ART" refers to the structure shown in FIG. 1 in which the corner portion inner lands 5 are omitted. "NUMBER OF WITHSTOOD DROP CYCLES" in Table 1 indicates that the number of drops that the electronic component modules were able to withstand without breakage during drop testing. For example, when the number of withstood drop cycles is 3, it means that breakage occurred on the fourth drop. The results of Table 1 demonstrate that, with preferred embodiments of the present invention, shock resistance is improved as compared to the structures of the known art.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic component module comprising:
a ceramic substrate having a front surface and a rear surface; and
a plurality of bonding material applying lands arranged on the rear surface of the ceramic substrate; wherein
the plurality of bonding material applying lands includes outer peripheral land rows, each of which is arranged in a line along each side of the rear surface with the exception of corner portions of the rear surface;
the plurality of bonding material applying lands includes corner portion inner lands, each of which is arranged on the rear surface at a location that is shifted inwardly in a substantially diagonal direction from a respective one of the corner portions and is adjacent to the bonding material applying lands closest to the respective one of the corner portions at ends of the outer peripheral land rows that are arranged in lines along two sides that are connected by the respective one of the corner portions;
the plurality of bonding material applying lands are arranged to be bonded to a motherboard via one of solder and a conductive adhesive;
each of the plurality of bonding material applying lands in the outer peripheral land rows is substantially rectangular and includes two longer sides and two shorter sides;
each of the corner portion inner lands is substantially square;
the short sides of each of the plurality of bonding material applying lands in the outer peripheral land rows have substantially the same width as the sides of each of the corner portion lands; and
each side of each of the corner portion lands is disposed along an extension line of a side of a bonding material applying land in the outer peripheral land rows that is disposed adjacent to the respective corner portion land.

2. The electronic component module according to claim 1, wherein no bonding material applying land is present at a location that is adjacent to the inner side of the corner portion inner land in a substantially diagonal direction of the rear surface.

3. The electronic component module according to claim 1, wherein a non-bonding material applying land is arranged at each corner portion of the rear surface.

4. The electronic component module according to claim 1, wherein the shape of the rear surface is substantially rectangular, and the electronic component module further comprises at least one short side inner land rows that are arranged in lines adjacent to the inner side of the at least one outer peripheral land row that is arranged on the short side of the rear surface.

5. The electronic component module according to claim 4, wherein a recess is provided on the rear surface so as to include a location that is adjacent to the inner side of the short side inner land row, and a surface mounting component is mounted in the recess.

6. The electronic component module according to claim 1, wherein a recess is provided at an approximate center of the rear surface, and a surface mounting component is mounted in the recess.

7. The electronic component module according to claim 1, wherein a surface mounting component is mounted on a front surface of the ceramic substrate.

* * * * *